(12) United States Patent
Wang

(10) Patent No.: US 7,491,568 B2
(45) Date of Patent: Feb. 17, 2009

(54) WAFER LEVEL PACKAGE AND METHOD FOR MAKING THE SAME

(75) Inventor: Wei-Chung Wang, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 462 days.

(21) Appl. No.: 11/314,341

(22) Filed: Dec. 22, 2005

(65) Prior Publication Data
US 2007/0048899 A1    Mar. 1, 2007

(30) Foreign Application Priority Data
Aug. 24, 2005   (TW) .............................. 94128942 A

(51) Int. Cl.
*H01L 21/00* (2006.01)

(52) U.S. Cl. ........................................................ 438/51

(58) Field of Classification Search ........................ None
See application file for complete search history.

(56) References Cited

U.S. PATENT DOCUMENTS 6,392,144 B1 *  5/2002  Filter et al. .................. 174/535
6,492,203 B1 * 12/2002  Wakashima et al. .......... 438/127
6,562,656 B1 *  5/2003  Ho .............................. 438/107
6,724,705 B1   4/2004  Lee et al.

\* cited by examiner

*Primary Examiner*—Charles D. Garber
*Assistant Examiner*—Andre' C Stevenson
(74) *Attorney, Agent, or Firm*—Volentine & Whitt, P.L.L.C.

(57) ABSTRACT

The present invention relates to a wafer level package and method for making the same. The method of the invention comprises: (a) providing a metal layer, the metal layer having a first surface and a second surface; (b) forming a plurality of first caves and a plurality of second caves on the first surface; (c) forming a cover in each first cave and around each first cave and forming a conductive portion in each second cave and around each second cave; (d) disposing a wafer onto the covers and the conductive portions; and (e) removing the metal layer. Whereby the process of the invention will be shortened and the cost will decrease. The method of invention provides the conductive portions used for convenient leads connecting with outer components and further decreases the size of the package.

8 Claims, 7 Drawing Sheets

WAFER LEVEL PACKAGE AND METHOD FOR MAKING THE SAME

BACKGROUND OF THE INVENTION

1. Field of the Invention

The invention relates to a wafer level packaging method, particularly to a wafer level packaging method for elements with fragile structure.

2. Description of the Related Art

FIGS. 1A to 1J show a conventional wafer level packaging method. Referring to FIGS. 1A to 1D, firstly, a metal layer 10 (for example, copper) having a first surface 101 and a second surface 102 is provided, and the second surface 102 corresponds to the first surface 101. Then, a plurality of caves 103 are formed on the first surface 101.

The caves 103 are formed by the following steps. Referring to FIG. 1A, a first photoresist 11 is formed on the first surface 101 and the second surface 102 respectively. Referring to FIG. 1B, a plurality of first openings 111 are formed on the first photoresist 11. The first openings 111 are formed by using exposure and development. Referring to FIG. 1C, the first surface 101 being corresponding to the first openings 111 is etched to form the caves 103. The first openings 111 corresponding to caves 103 are used for formed the caves 103. Referring to FIG. 1D, the first photoresist 11 is removed.

FIGS. 1E and 1F show that a cover 13 is formed in the cave 103 and around the cave 103. The cover 13 is formed by the following steps. Referring to FIG. 1E, a second photoresist 12 is formed on the first surface 101 and the second surface 102 respectively. The second openings 121 are formed by using exposure and development. A plurality of second openings 121 are formed on the second photoresist 12. The second openings 121 are larger than the caves 103 and respectively correspond to the caves 103. Referring to FIG. 1F, a cover 13 is formed in the cave 103 and around the cave 103. The cover 13 has a first part 131 and a second part 132. The first part 131 of the cover 13 is disposed in the cave 103. The second part 132 of the cover 13 is disposed on the first surface 101 and around the cave 103.

Referring to FIG. 1G, a wafer 14 is disposed onto the covers 13. The wafer 14 has an active surface 141, and a plurality of micro-mechanical elements 142 and separating walls 143 are disposed on the active surface 141. Each micro-mechanical element 142 is disposed in the corresponding cover 13. Each separating wall 143 is disposed on the corresponding second part 132 of the cover 13. Referring to FIG. 1H, the metal layer 10 is removed.

Referring to FIGS. 1I and 1J, they show the final process of the conventional wafer level package structure. The wafer 14 is upside-down. Utilizing a conventional bump chip carrier (BCC) process, the wafer 14 is bonded with wires 15. Finally, the wafer 14 is encapsulated with encapsulating material 16 to form a conventional wafer level package structure 1.

There are some shortcomings in the above-mentioned conventional wafer level packaging method, such as that leads of the conventional wafer level package structure 1 electrically connecting with outer elements must be formed by utilizing the conventional bump chip carrier (BCC) process. As a result, the packaging process is complicated, and the cost will increase. Moreover, the size of the conventional wafer level package structure 1 will be big.

Consequently, there is an existing need for providing a wafer level package and method for making the same to solve the above-mentioned problems.

SUMMARY OF THE INVENTION

One objective of the present invention is to provide a wafer level packaging method. The method of the invention comprises the steps of: (a) providing a metal layer, the metal layer having a first surface and a second surface; (b) forming a plurality of first caves and a plurality of second caves on the first surface; (c) forming a cover in each first cave and around each first cave and forming a conductive portion in each second cave and around each second cave; (d) disposing a wafer onto the covers and the conductive portions; and (e) removing the metal layer.

Another objective of the present invention is to provide a wafer level package structure. The package structure comprises a wafer, a plurality of covers and a plurality of conductive portions. The wafer has an active surface, and a plurality of micro-mechanical elements and solder pads are disposed on the active surface. The covers are disposed on the active surface and cover the micro-mechanical elements. The conductive portions are attached to the solder pads.

By utilizing the wafer level package and method for making the same, the process will be shortened and the cost will decrease. The method of invention provides the conductive portions used for convenient leads connecting with outer components and further decreases the size of the package.

BRIEF DESCRIPTION OF THE DRAWINGS

FIGS. 2A to 2H show a wafer level packaging method of the present invention; wherein FIG. 2H shows a wafer level package structure of the present invention.

DETAILED DESCRIPTION OF THE INVENTION

Figure 1A:
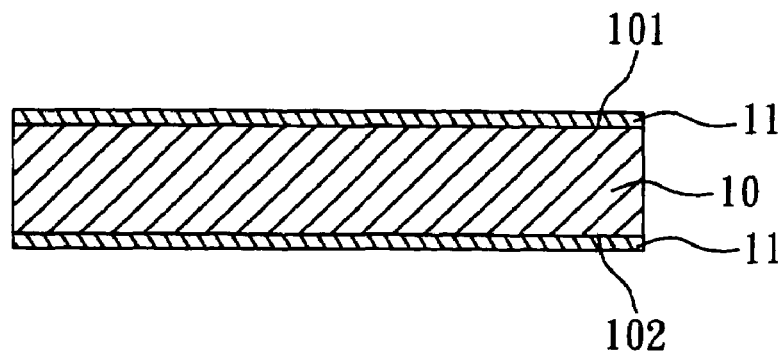
FIGS. 1A to 1J show a conventional wafer level packaging method.
Figure 1B:
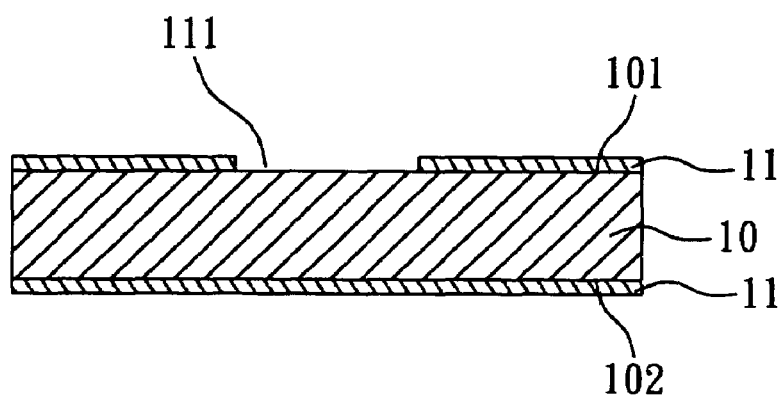
Figure 1C:
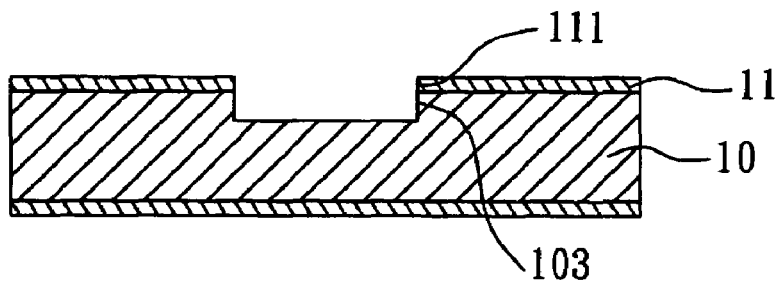
Figure 1D:
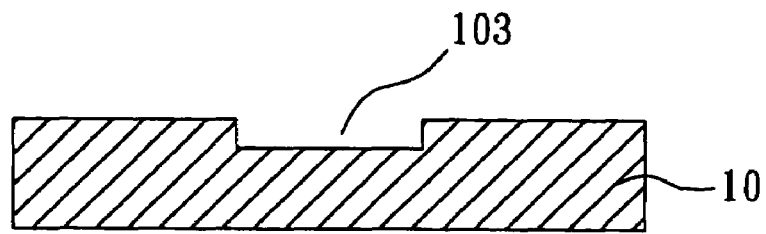
Figure 1E:
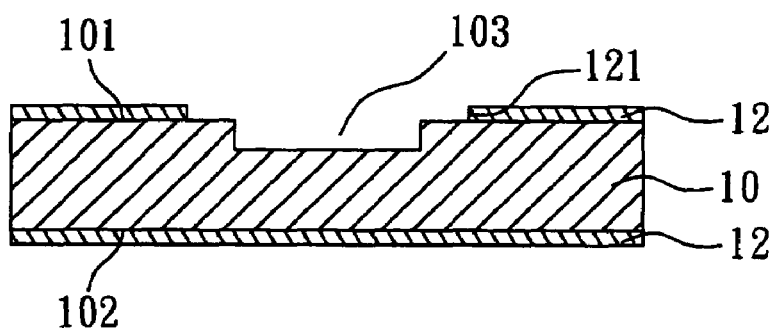
Figure 1F:
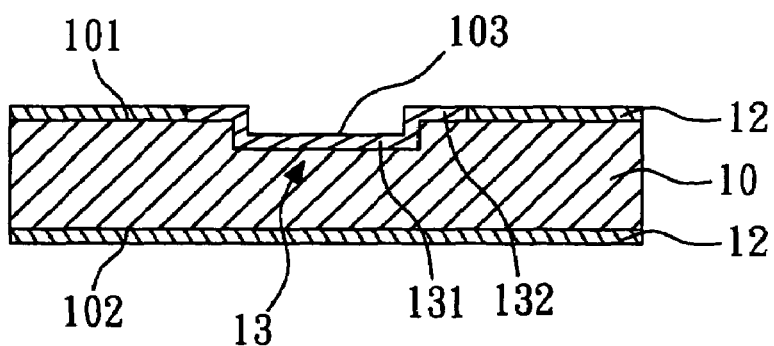
Figure 1G:
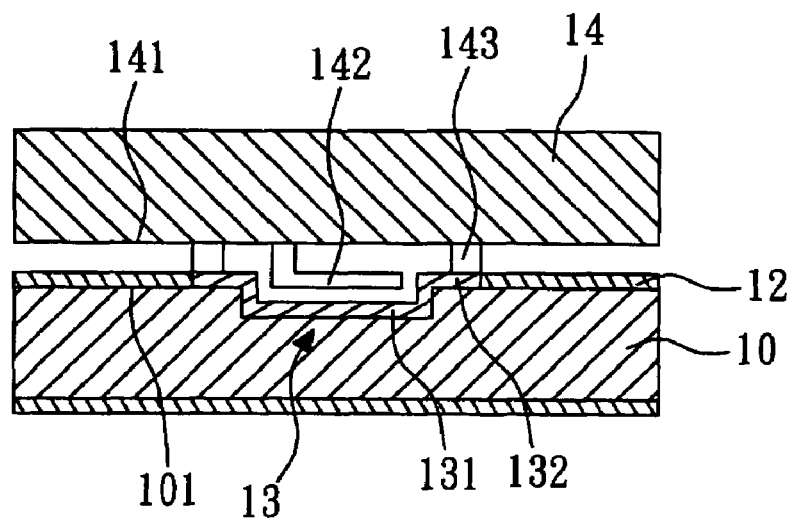
Figure 1H:
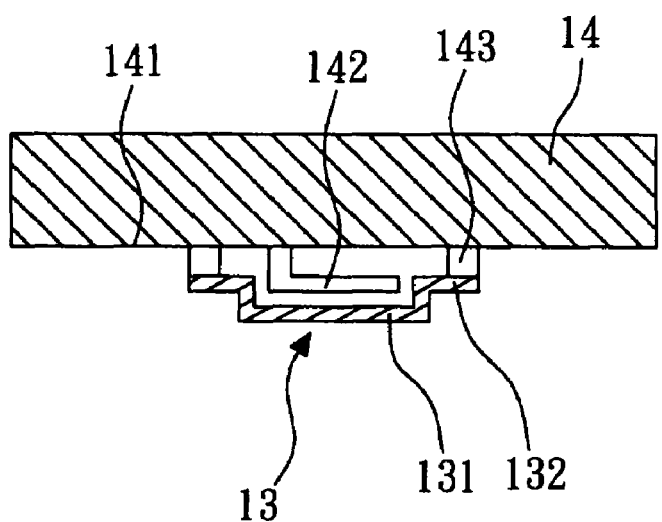
Figure 1I:
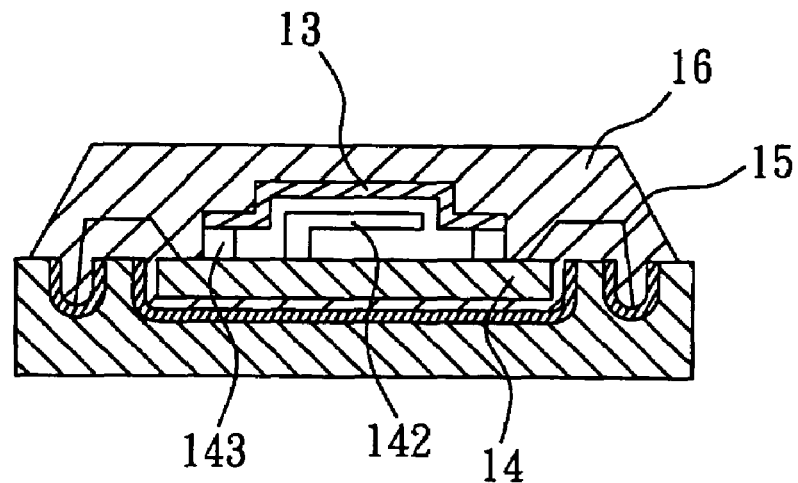
Figure 1J:
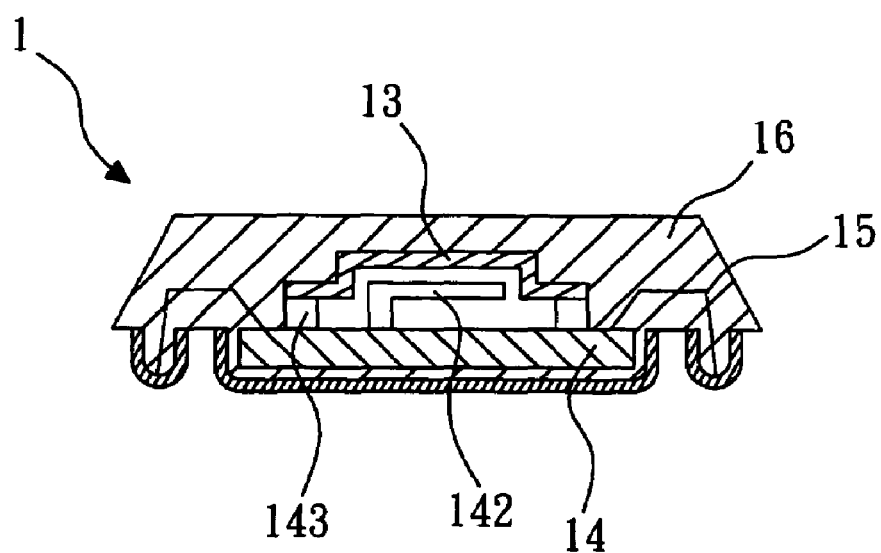

FIGS. 2A to 2H show a wafer level packaging method of the present invention. Referring to FIGS. 2A to 2D, firstly, a metal layer 20 (for example, copper) having a first surface 201 and a second surface 202 is provided, and the second surface 202 corresponds to the first surface 201. Then, a plurality of first caves 203 and second caves 204 are formed on the first surface 201.

Figure 2A:
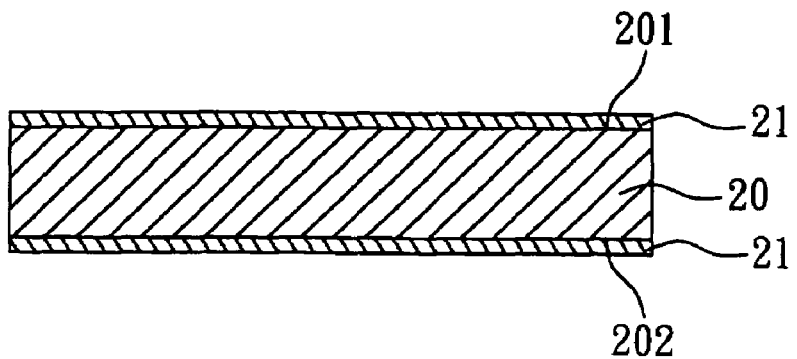
Figure 2B:
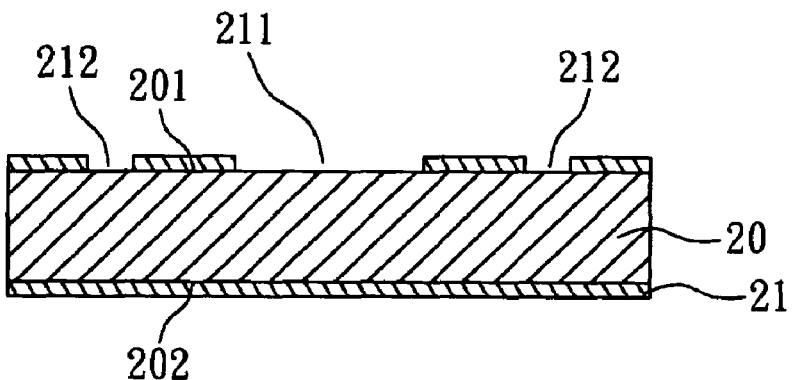
Figure 2C:
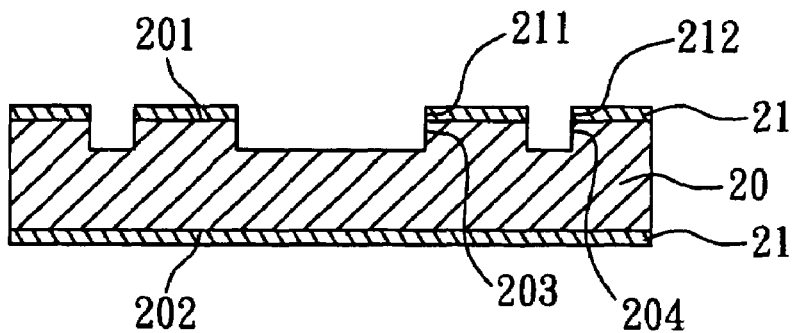
Figure 2D:
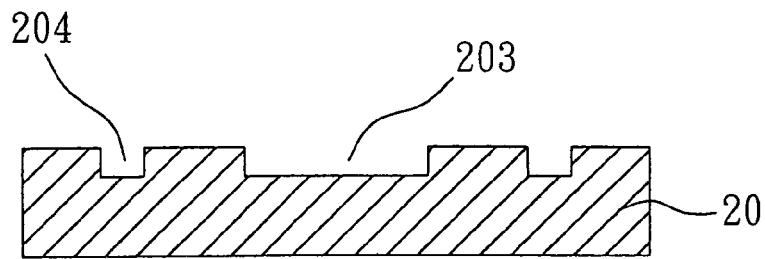

In the embodiment, the first caves 203 and the second caves 204 are formed by the following steps. Referring to FIG. 2A, a first photoresist 21 is formed on the first surface 201 and the second surface 202 respectively. Referring to FIG. 2B, a plurality of first openings 211 and second openings 212 are formed on the first photoresist 21. The first openings 211 and the second openings 212 are formed by using exposure and development. Referring to FIG. 2C, the first surface 201 corresponding to the first openings 211 and the second openings 212 is etched to form the first caves 203 and the second caves 204. The first openings 211 and the second openings 212 respectively corresponding to the first caves 203 and the second caves 204 are used for forming the first caves 203 and the second caves 204. Referring to FIG. 2D, the first photoresist 21 is removed.

Figure 2E:
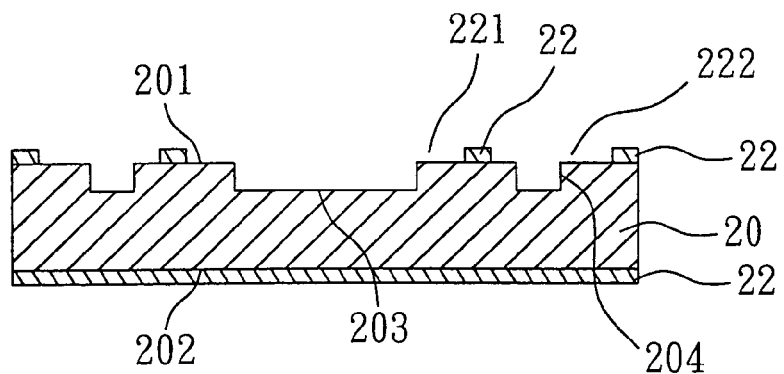
Figure 2F:
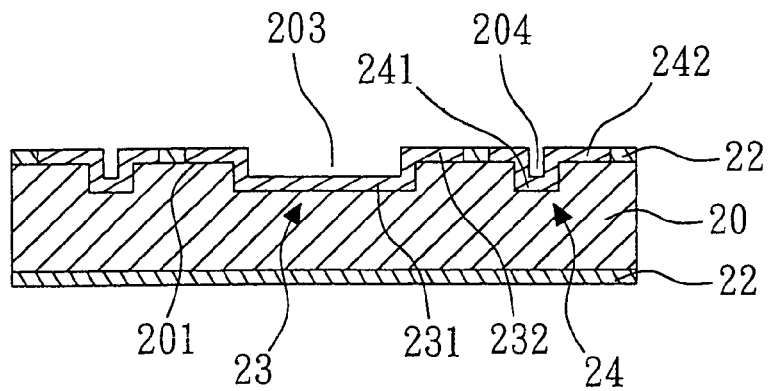

FIGS. 2E and 2F show methods for forming a cover and a conductive portion. The cover 23 and the conductive portion 24 are formed by the following steps. Referring to FIG. 2E, a second photoresist 22 is formed on the first surface 201 and the second surface 202; and a plurality of third openings 221 and fourth openings 222 are formed on the second photoresist 22. The third openings 221 and the fourth openings 222 are larger than the first caves 203 and the second caves 204 and respectively corresponding to the first caves 203 and the second caves 204.

Referring to FIG. 2F, a cover 23 is formed in the first cave 203 and around the first cave 203, and a conductive portion 24 is formed in the second cave 204 and around the second cave 204. The cover 23 has a first part 231 and a second part 232. The first part 231 of the cover 23 is disposed in the first cave 203. The second part 232 of the cover 23 is disposed on the first surface 201 and around the first cave 203. The conductive portion 24 has a first part 241 and a second part 242. The first part 241 of the conductive portion 24 is disposed in the second cave 204. The second part 242 of the conductive portion 24 is disposed on the first surface 201 and around the second cave 204.

Figure 2G:
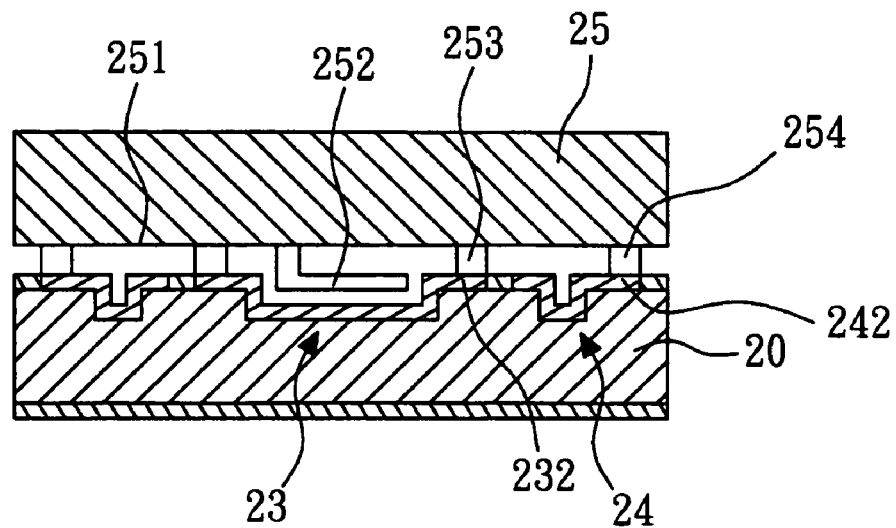
Figure 2H:
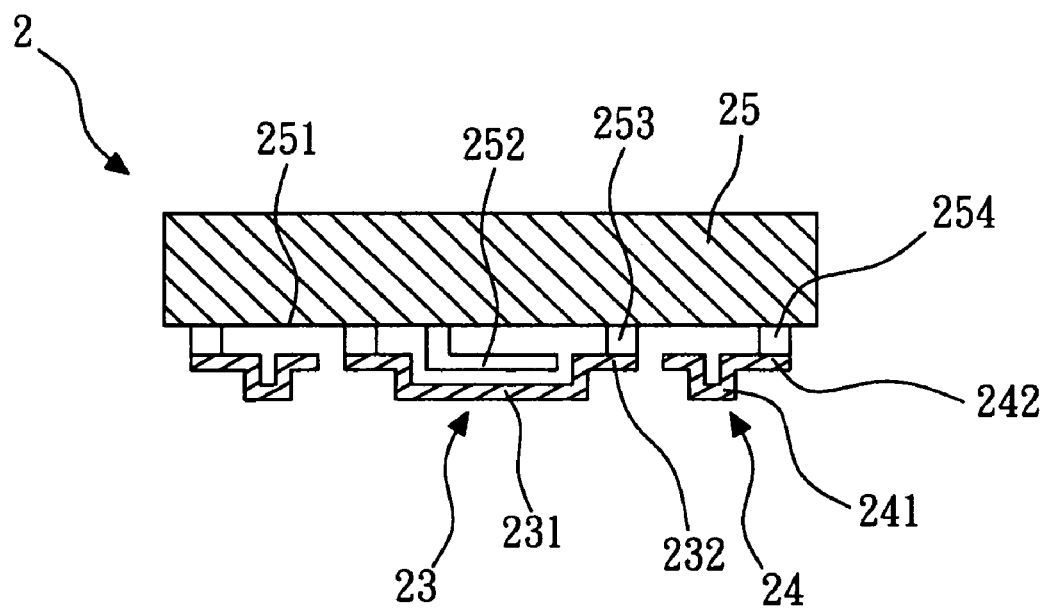

Referring to FIG. 2G, a wafer 25 is disposed onto the covers 23 and the conductive portions 24. The wafer 25 has an active surface 251, and a plurality of micro-mechanical elements 252, separating walls 253 and solder pads 254 are disposed on the active surface 251. Each micro-mechanical element 252 is disposed in the corresponding cover 23. Each separating wall 253 is disposed at the corresponding second part 232 of the cover 23. Each solder pad 254 is disposed at the corresponding second part 242 of the conductive portion 24, and electrically connects with the second part 242 of the conductive portion 24. Referring to FIG. 2H, the metal layer 20 is removed to form a wafer level package structure 2.

FIG. 2H shows a wafer level package structure 2 of the present invention. The package structure 2 comprises a wafer 25, a plurality of covers 23 and a plurality of conductive portions 24. The wafer 25 has an active surface 251, and a plurality of micro-mechanical elements 252, separating walls 253 and solder pads 254 are disposed on the active surface 251. Each micro-mechanical element 252 is disposed in the corresponding cover 23. Each cover 23 has a first part 231 and a second part 232, and the second part 232 of the cover 23 is attached to the separating wall 253. The covers 23 are cap-like and cover the micro-mechanical elements 252.

The separating wall 253 can be a conductive or non-conductive material. In the embodiment, the separating wall 253 is a colloid, and the colloid can be a UV (ultraviolet) light cure adhesive. The separating wall 253 is disposed around the micro-mechanical elements 252.

The conductive portion 24 has a first part 241 and a second part 242.

The first part 241 of the conductive portion 24 is a raised portion, and the second part 242 of the conductive portion 24 is attached to the solder pads 254. Each solder pad 254 electrically connects with the second part 242 of the conductive portion 24, and the conductive portions 24 are used as leads to electrically connect with outer elements, for example, a printed circuit board.

In the wafer level packaging method of the present invention, the covers 23 and the conductive portions 24 are formed at the same time, and the conductive portions 24 are used as leads of the wafer level package structure 2 to electrically connect with outer elements. As a result, the process of forming leads of the conventional skill, bump chip carrier (BCC) process, can be omitted, and thus the process will be shortened and the cost will decrease. The method of invention provides the conductive portions 24 used for convenient leads connecting with outer components and further decreases the size of the package.

While the embodiment of the present invention has been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A wafer level packaging method comprising the steps of:
   (a) providing a metal layer, the metal layer having a first surface and a second surface;
   (b) forming a plurality of first caves and a plurality of second caves on the first surface;
   (c) forming a cover in each first cave and around each first cave, and forming a conductive portion in each second cave and around each second cave;
   (d) disposing a wafer onto the covers and the conductive portions; and
   (e) removing the metal layer.

2. The method according to claim 1, wherein the metal layer is copper in the step (a).

3. The method according to claim 1, wherein the step (b) comprises the steps of:
   (b1) forming a first photoresist on the first surface and the second surface;
   (b2) forming a plurality of first openings and second openings on the first photoresist, the first openings and the second openings respectively corresponding to the first caves and the second caves on the first surface;
   (b3) etching the first surface being corresponding to the first openings and the second openings to form the first caves and the second caves; and
   (b4) removing the first photoresist.

4. The method according to claim 1, wherein the step (c) comprises the steps of:
   (c1) forming a second photoresist on the first surface and the second surface; and
   (c2) forming a plurality of third openings and fourth openings on the second photoresist, the third openings and the fourth openings being larger than the first caves and the second caves, and respectively corresponding to the first caves and the second caves on the first surface.

5. The method according to claim 1, wherein a plurality of micro-mechanical elements, separating walls and solder pads are disposed on an active surface of the wafer in the step (d).

6. The method according to claim 5, wherein each micro-mechanical element is disposed in the corresponding cover.

7. The method according to claim 5, wherein the cover has a first part and a second part, and each separating wall is disposed at the corresponding second part of the cover.

8. The method according to claim 5, wherein the conductive portion has a first part and a second part, and each solder pad is disposed at the corresponding second part of the conductive portion and electrically connects with the second part of the conductive portion.

* * * * *